US012659772B2

(12) United States Patent
Ruengeler

(10) Patent No.: US 12,659,772 B2
(45) Date of Patent: Jun. 16, 2026

(54) MEASUREMENT SYSTEM FOR MEASURING AN INTERCEPT POINT VALUE OF A DEVICE-UNDER-TEST

(71) Applicant: Rohde & Schwarz GmbH & Co. KG, Munich (DE)

(72) Inventor: Matthias Ruengeler, Kirchheim (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 322 days.

(21) Appl. No.: 18/411,952

(22) Filed: Jan. 12, 2024

(65) Prior Publication Data

US 2024/0306018 A1 Sep. 12, 2024

(30) Foreign Application Priority Data

Mar. 10, 2023 (EP) ...................................... 23161100

(51) Int. Cl.
*H04W 24/08* (2009.01)
*G01R 31/28* (2006.01)
(Continued)

(52) U.S. Cl.
CPC ........ *H04W 24/08* (2013.01); *G01R 31/2839* (2013.01); *H04B 17/15* (2015.01); *H04B 17/29* (2015.01)

(58) Field of Classification Search
CPC ...................... G01R 31/2836; G01R 31/2839; H04B 17/15; H04B 17/29; H04W 24/08
See application file for complete search history.

(56) References Cited

U.S. PATENT DOCUMENTS 5,844,512 A * 12/1998 Gorin .................. H03M 1/0629
341/139
6,529,844 B1 * 3/2003 Kapetanic ................. H03L 7/22
324/613

(Continued)

FOREIGN PATENT DOCUMENTS

CN 102628897 A 8/2012
CN 110868261 A 3/2020

OTHER PUBLICATIONS

Chan, Kuo-Chang; "The IP3 Specification—Demystified;" Maxim Integrated Products, Inc.; Mar. 12, 2013, pp. 1-16; [online] https://www.analog.com/media/en/techni cal-documentation/tech-articles/ip3-and-intermodulation-guide--maxim-integrated.pdf.

(Continued)

*Primary Examiner* — Jeong S Park
(74) *Attorney, Agent, or Firm* — Studebaker Brackett PLLC

(57) ABSTRACT

The invention relates to a measurement system for measuring an intercept point, IPx, value of a device-under-test, DUT. The system includes: an input port arranged for being directly or indirectly connected to the DUT; and a measurement unit which is connected to the input port. The input port is configured to receive a first CW signal, a second CW signal, and at least one intermodulation signal of the first and the second CW signal from the DUT, and to forward the signals to the measurement unit. The measurement unit is configured to perform an IPx measurement. The IPx measurement includes measuring a signal level of at least one or both of the first and the second CW signal, and measuring a signal level of the at least one intermodulation signal. The measurement unit is operable in a first operating mode and/or in a second operating mode.

19 Claims, 5 Drawing Sheets

10

(51) Int. Cl.
    *H04B 17/15*      (2015.01)
    *H04B 17/29*      (2015.01)

(56)            References Cited

U.S. PATENT DOCUMENTS

| | | | |
|---|---|---|---|
| 8,010,074 B2 | 8/2011 | Kaczman et al. | |
| 8,026,728 B2 | 9/2011 | Gorin et al. | |
| 9,356,711 B2 | 5/2016 | Kahrizi et al. | |
| 11,619,662 B1 * | 4/2023 | Bonaguide | G01R 31/31917 |
| | | | 324/95 |
| 2006/0290358 A1 * | 12/2006 | Motta | G01R 23/20 |
| | | | 324/634 |
| 2016/0087660 A1 * | 3/2016 | Dunsmore | H04B 1/1027 |
| | | | 455/249.1 |
| 2019/0103892 A1 * | 4/2019 | Alzaher | H03F 3/45636 |
| 2019/0356397 A1 * | 11/2019 | DaSilva | G01R 1/045 |
| 2024/0305389 A1 * | 9/2024 | Abouzied | H03F 1/223 |
| 2025/0027986 A1 * | 1/2025 | Lueck | G01R 31/31917 |

OTHER PUBLICATIONS

Ali-Ahmad, Walid Y.; "Improving the receiver intercept point using selectivity;" RF Design, Primedia Business Magazines & Media; XP000735883; Overland Park, KS, US; vol. 20, No. 12; Dec. 1, 1997; pp. 1-4.
Extended European Search Report issued in EP 23 161 100.5-1001 by the European Patent Office on Sep. 6, 2023.

\* cited by examiner

MEASUREMENT SYSTEM FOR MEASURING AN INTERCEPT POINT VALUE OF A DEVICE-UNDER-TEST

TECHNICAL FIELD OF THE INVENTION

In general, the invention relates to characterizing nonlinear transmission properties of RF devices. More specifically, the invention relates to a measurement system for measuring an intercept point (IPx) value of a device-under-test (DUT).

BACKGROUND OF THE INVENTION

RF devices, such as receivers or amplifiers, can have nonlinear transmission properties. When these devices are fed with sinusoidal input signals, higher harmonics can form at the output.

When the signal level of the input signals increases, the signal level of these harmonics can increase at an even higher rate, until an intercept point is reached. Depending on the order of the harmonics, different intercept points exist, e.g., the third order intercept point (IP3).

However, it is difficult to characterize the nonlinear transmission properties of an RF device, because any measurement instrument usually also exhibits nonlinear properties which impact the measurement result. This can make the measurement unreliable.

SUMMARY OF THE INVENTION

Thus, it is an objective to provide a measurement system for measuring an intercept point value of a device-under-test. In particular, the above-mentioned disadvantages should be avoided.

The objective is achieved by the solution provided in the enclosed independent claims. Advantageous implementations of the present invention are further defined in the dependent claims.

According to a first aspect, the invention relates to a measurement system for measuring an intercept point (IPx) value of a device-under-test (DUT). The measurement system comprises: an input port which is arranged for being directly or indirectly connected to the DUT; and a measurement unit which is connected to the input port; wherein the input port is configured to receive a first CW signal and/or a second CW signal from the DUT, and to receive at least one intermodulation signal of the first and the second CW signal from the DUT, and to forward the received signals to the measurement unit; wherein the measurement unit is configured to perform an IPx measurement. The IPx measurement comprises: measuring a signal level of at least one or both of the first and the second CW signal, and measuring a signal level of the at least one intermodulation signal. The measurement unit is operable in a first operating mode and/or in a second operating mode; wherein, in the first operating mode, the measurement unit is configured to calculate the IPx value of the DUT based on the results of the IPx measurement and on stored IPx information of the measurement system; and wherein, in the second operating mode, the measurement unit is configured to conduct a plurality of IPx measurements, wherein a characteristic of the measurement system is changed during at least one of the IPx measurements, and wherein the measurement unit is configured to calculate the IPx value of the DUT based on the plurality of IPx measurements.

This achieves the advantage that an IPx value of the DUT can be reliably measured, wherein an influenced of the measurement system itself on the determined IPx value due to its nonlinear properties can be avoided.

Preferably, the IPx value is an IP3 value, i.e., a third order intercept point value (also referred to as: TOI). However, the IPx value can also be an IP2, IP4 or IP5 value (second, fourth or fifth order intercept point value).

For example, in the first operating mode, a total IPx value of the DUT and measurement system can be calculated based on one IPx measurement. Then, a known IPx value of the measurement system (stored as IPx information) can be deducted from the total IPx value yielding the IPx value of the DUT. This first operating mode can provide the advantage of being relatively quick.

The stored IPx information, which is used in the first operating mode, can comprise at least one IPx value of the measurement system, e.g., at least one IPx value of one or more internal or external components of the measurement system. For instance, the comprise IPx information can (an) IPx value (s) of a (pre) amplifier, an attenuator, a mixing unit, and/or an analog-to-digital converter (ADC) of the measurement system or the measurement unit.

The IPx information can be TOI (third-order-intercept) information. The IPx information can be stored in a memory of the system, in particular of the measurement unit. For instance, the IPx information is stored in a calibration file.

In the second operating mode, multiple IPx measurements are carried out, wherein each of these IPx measurements calculates the total IPx value of the DUT and the system. Thereby, for at least one, preferably for each, of the IPx measurements a characteristic of the system is changed in a known way. The individual IPx values of the measurement system and of the DUT can then be derived from the multiple IPx measurements.

The characteristic of the measurement system, which is changed in the second operating mode, can be a property of the measurement system, in particular of an internal or external component of the measurement system. For instance, the characteristic is an attenuation or a gain in a measurement path of the measurement system, in particular, of the measurement unit.

The first and the second CW (continuous wave) signal can each be sinusoidal signals. Each of these signals can be an RF signal with a different center frequency. For example, the first and the second CW signal can be narrowband signals.

Each intermodulation signal can comprise or represent at least one nonlinear intermodulation product of the first and second CW signal. For instance, one intermodulation signal comprises or represents a third-order nonlinear product (or third harmonic) of the two CW signals. Further intermodulation signals can comprise or represent a respective second-, fourth- or fifth-order nonlinear product.

The DUT can be an RF device. In particular, the DUT is a two-port device, such as an amplifier or an attenuator. The first and the second CW signals can be signals which are transmitted by the DUT, wherein the DUT generates the at least one intermodulation signal of the first and the second CW signal during said transmission.

In an embodiment, in the second operating mode, the measurement unit is configured to determine IPx information of the measurement system based on the plurality of IPx measurements.

For instance, in the second operating mode, a gain or an attenuation in a signaling path of the measurement system can be changed for each of the IPx measurements. The IPx information of the system can be obtained from comparing the results of these measurements.

In an embodiment, the measurement system comprises a memory, wherein the measurement unit is configured to store the determined IPx information in the memory. This achieves the advantage that the information can be used for a later measurement, e.g., when subsequently operating in the first operating mode.

In an embodiment, after determining the IPx information of the measurement system (10) in the second operating mode, the measurement system (10) is configured to conduct subsequent measurements of IPx values, for example of further DUTs or of the DUT at different settings, in the first operating mode, thereby using the previously determined IPx information. This achieves the advantage that the measurement speed can be increased, as measurements can mostly be carried out according to the (faster) first operating mode using IPx information derived in a previous measurement according to the second operating mode.

In an embodiment, for each IPx measurement, the measurement unit is configured to calculate a sensitivity value of the DUT and/or of the measurement system, in particular of one or more internal or external components of the measurement system.

In general, a sensitivity value can be a measure of the ability of the system, in particular of the system component (s), or of the DUT to measure and/or process (e.g., demodulate and get information from) a weak signal.

Here, the sensitivity value of the component can further indicate by how much an IPx value of the component contributes to a measured total IPx value of the system and the DUT.

In an embodiment, the measurement system is configured to display the calculated sensitivity value (s).

In an embodiment, in the second operating mode, the measurement unit is configured to change a characteristic, in particular an at attenuation, of at least one internal component of the measurement system during at least one of the IPx measurements until a sensitivity value of the internal component reaches a limit.

The internal component can be an amplifier, an attenuator, a mixing unit, and/or an ADC. The limit can be a lower limit, i.e., a minimal sensitivity of the component.

In an example, in the second operating mode, the IPx value (s) of the system component (s) can be increased step by step until the total IPx value of the system and the DUT no longer changes. This "total IPx value" can then be approximated as the IPx value of the DUT.

In an embodiment, the measurement unit is configured to determine a signal level of a noise floor.

In particular, the noise floor can be a measure of a signal created from the sum of all noise sources and/or unwanted signals within the measurement system.

In an embodiment, the measurement unit is configured to calculate a signal-to-noise ratio (SNR) value of the at least one intermodulation signal based on the determined signal level of the noise floor.

In an embodiment, the measurement unit is configured to discard an IPx measurement if the SNR value of the at least one intermodulation signal is below a threshold value.

The threshold value can be stored in the memory of the system.

In an embodiment, the measurement unit comprises an analog-to-digital converter ADC; wherein the measurement unit is configured to discard an IPx measurement if the ADC is in an overload state.

The ADC can be configured to receive and digitalize the first CW signal, the second CW signal and/or the at least one intermodulation signal.

The measurement unit can further comprise a control and/or processing unit which is configured to carry out the IPx measurements.

In an embodiment, the input port is arranged for being connected to the DUT through at least one external component, such as an attenuator, an amplifier, a mixer and/or a cable.

In an embodiment, in the first operating mode, the stored IPx information of the measurement system comprises IPx information of the at least one external component; and/or, in the second operating mode, a characteristic of the external component is changed during at least a further one of the IPx measurements. This achieves the advantage that also the properties of external components (connected between DUT and input port) can be considered when calculating the IPx value (s) of the system.

In an embodiment, the measurement system comprises a user interface which is configured to prompt a user to manually change a characteristic of the external component; wherein the measurement unit is configured to perform the further one of the IPx measurements in the second operating mode after the user has confirmed the change of the characteristic, e.g., via the user interface.

The characteristic of the external component can be an attenuation or a gain of the external component. For instance, this characteristic can be changed manually by the user.

In an embodiment, the measurement unit is configured to use IQ averaging to measure the signal level of the first CW signal, the second CW signal, and/or the at least one intermodulation signal.

For example, the measurement system comprises a DAC which is configured to convert the first and second CW signal and/or the at least one intermodulation signal to an IQ signal.

In an embodiment, the measurement unit is configured to output a quality information which indicates a quality of an IPx measurement; wherein the quality information comprises at least one of: a SNR value, a sensitivity value, a difference between the signal levels of the first and the second CW signal, a difference between signal levels of intermodulation products.

In particular, the difference between signal levels of intermodulation products can be shown if more than one intermodulation signal is used.

In an embodiment, the measurement system further comprises a signal generator which is configured to generate at least one RF signal and to forward said RF signal to the DUT and/or to the input port; wherein settings of the signal generator can be adjusted such that a IPx value of the signal generator is increased above a threshold and/or the IPx value of the signal generator is maximized.

Typically, the signal generator is arranged before the DUT and thus connected to the input port via the DUT. However, for adjusting the settings of the signal generator, the signal generator can be directly connected to the input port (i.e., not via the DUT).

The first and the second CW signal and the at least one intermodulation signal which are emitted by the DUT can be based on the RF signal (s) generated by the signal generator. For instance, the first and the second CW signal correspond to a first respectively a second RF signal generated by the signal generator after transmission by the DUT.

In an embodiment, the measurement system comprises a center frequency which is different from a frequency in the middle between the first and the second CW signal. This achieves the advantage that it can be avoided that the signal level measurements becomes inaccurate.

In an embodiment, the measurement system further comprises a pre-selectable filter stage comprising a first filter function and a second filter function, wherein the measurement unit is configured to apply the first filter function when measuring the signal level of the first and/or the second CW signal, and wherein the measurement unit is configured to apply the second filter function when measuring the signal level of the at least one intermodulation signal.

Here, applying the filter function may refer to filtering the respective signal (s) with the filter function.

BRIEF DESCRIPTION OF THE DRAWINGS

The invention will be explained in the following together with the figures.

DETAILED DESCRIPTION OF THE PREFERRED EMBODIMENTS

Figure 1:
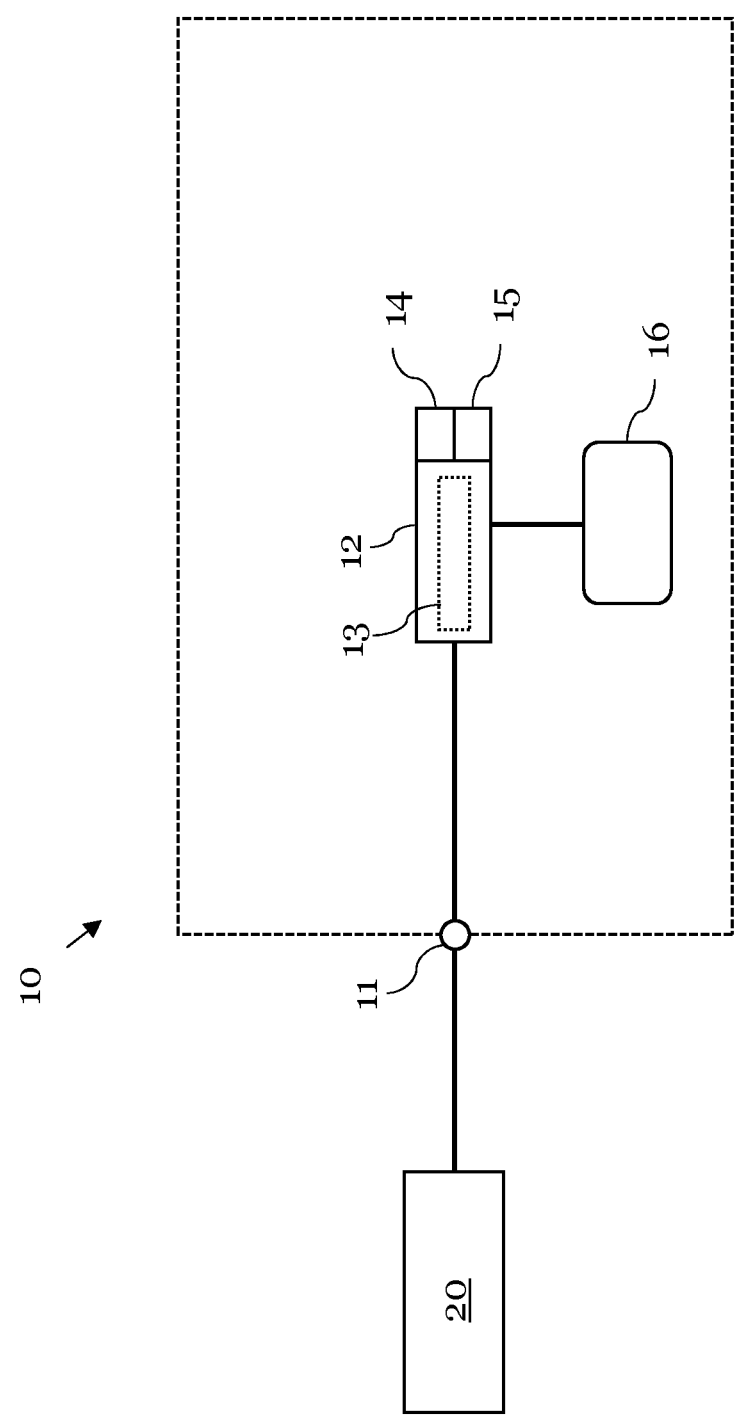
FIG. 1 shows a schematic diagram of a measurement system for measuring an IPx value of a DUT according to an embodiment.

FIG. 1 shows a schematic diagram of a measurement system 10 for measuring an IPx value of a DUT 20 according to an embodiment.

The measurement system 10 comprises: an input port 11 which is arranged for being directly or indirectly connected to the DUT 20; and a measurement unit 12 which is connected to the input port 11; wherein the input port 11 is configured to receive one or both of a first CW signal and a second CW signal from the DUT, and wherein the input port 11 is further configured to receive at least one intermodulation signal of the first and the second CW signal from the DUT 20, wherein the input port 11 is configured to forward said signals (the first and the second CW signal and the at least one intermodulation signal) to the measurement unit 12. The measurement unit 12 is configured to perform an IPx measurement, wherein the IPx measurement comprises: measuring a signal level of at least one or both of the first and the second CW signal, and measuring a signal level of the at least one intermodulation signal. The measurement unit 12 is further operable in a first operating mode and/or in a second operating mode; wherein, in the first operating mode, the measurement unit 12 is configured to calculate the IPx value of the DUT 20 based on the results of the IPx measurement and on stored IPx information of the measurement system; and wherein, in the second operating mode, the measurement unit 12 is configured to conduct a plurality of IPx measurements, wherein a characteristic of the measurement system 10 is changed and/or adapted during at least one of the IPx measurements, and wherein the measurement unit is configured to calculate the IPx value of the DUT based on the plurality of IPx measurements.

The DUT 20 can be an RF device. In particular, the DUT 20 is a two-port device, such as an amplifier or an attenuator.

The first and the second CW signals can be signals which are transmitted by the DUT 20, wherein the at least one intermodulation signal of the first and the second CW signal can be generated during transmission through the DUT 20.

The input port 11 can be any suitable port for connecting an RF device, e.g., an RF port.

Preferably, the input port 11 is configured to receive at least one of the CW signals and the at least one intermodulation signal from the DUT. However, the measurement system 10 can also receive both CW signals together with one or more intermodulation signals of both CW signals.

The measurement system 10 can be a spectrum analyzer or an oscilloscope. The measurement system 10 can comprise a housing which is, e.g., indicated by a dashed rectangle in FIG. 1.

The first and the second CW (continuous wave) signals can each be sinusoidal signals. Each of these signals can be an RF signal with a different center frequency. The first and the second CW signal can further be narrowband signals. For example, the first and the second CW signal can form a two-tone signal.

The first and the second CW signals can be RF (radio frequency) signals, e.g., in a frequency range from 9 kHz to 300 GHZ. In particular, the first and the second CW signals can have frequencies typically used in 4G, 5G, 6G or WiFi applications.

The IPx value of the DUT, which is measured by the system 10, can be an IP3 value, i.e., a value (e.g., in dbm) of a third order intercept point. In this case, the at least one intermodulation signal, whose signal level is measured in the IPx measurement, is a third order intermodulation signal (i.e., an intermodulation product of the third order).

The IPx value can also be a second, fourth or fifth order intercept point value (IP2, IP4 or IP5 value).

In general, when conducting an IPx measurement, the IPx values of the system 10 are measured together with the IPx value of the DUT 20. In the first operating mode, the IPx values of the system 10 are known and can be deducted from the measurement of the total IPx (of system and DUT). In the second operating mode, the IPx values of the system 10 and of the DUT can be determined by a plurality of IPx measurements with changed system characteristics.

The stored IPx information, which is used in the first operating mode, can comprise at least one IPx value of the measurement system 10, e.g., at least one IPx value of an internal component 13 or element of the measurement system 10 or of the measurement unit 12. Preferably, the stored IPx information comprises the IPx value (s) of the entire system 10. In particular, this stored IPx information can be calibration data of the system.

The internal components 13 of the system 10, which contribute to the IPx value of the system 10, can comprise a (pre) amplifier, an attenuator, a mixing unit, and/or an analog-to-digital converter (ADC). For instance, the IPx information can comprise IPx values of said components. This internal components 13 can be components of the measurement unit 12.

In the second operating mode, the measurement unit 12 can be configured to determine IPx information of the measurement system 10 based on at least a part of the plurality of IPx measurements. Thereby, IPx values of the system components 13 can be determined.

For instance, in the second operating mode, a characteristic of the measurement system 10 is changed and/or adapted during each of the plurality of IPx measurements.

The same CW settings, i.e. same first and second CW signals, can be used in each of the plurality of IPx measurements.

The characteristic of the measurement system 10 that is changed in the second operating mode can be a gain or an attenuation in a signal path of the system 10. The measurement system 10, in particular the measurement unit 12, can be configured to change and/or adapt this characteristic by switching an attenuation stage or a gain stage in the signaling path.

A more detailed description of the IPx measurement (s) and the calculation of the IPx value (s) in the first and second operating mode is shown below with reference to FIGS. 4A-4B and 5A-5B.

The measurement unit 12 can comprise a memory 15. The memory 15 can be any suitable storage unit, e.g., a flash memory. For instance, the IPx information that is used in the first operating mode and/or that is determined in the second operating mode can be stored in the memory 15.

The IPx information that is used in the first operating mode can be generated in a previous measurement according the second operating mode. In particular, if no IPx information is stored in the memory, the measurement unit 12 can be configured to operate in the second operating mode. Subsequently, if sufficient IPx information on the system has been generated and stored (in the second mode), the measurement unit 12 can switch to the first operating mode to conduct further measurements, e.g., at different settings of the DUT 20 or with another DUT. Hence, the first operating mode, which is quicker than the second operating mode, can be used whenever possible.

The measurement unit 12 can further comprise a control and/or processing unit 14 which can be configured to carry out the IPx measurements and/or control the components of the system 10. The control and/or processing unit 14 can comprise a processor, e.g. a microprocessor or an FPGA (field programmable gate array).

The control and/or processing unit 14 can further control the change and/or adaption of the system characteristics during the second operating mode.

The measurement system 10 can comprise an optional display 16. The results of the IPx measurements and, in particular, the calculated IPx value of the DUT can be displayed on the display 16.

Furthermore, the measurement unit 12 can be configured to calculate a sensitivity value of one of: the DUT 20 or the measurement system 10, in particular an internal component 13 of the measurement unit 12.

The sensitivity value can express the sensitivity of the IPx respectively TOI measurement (partial derivative of measured TOI and TOI of signal component). For instance, sensitivity can be defined as the lowest signal power level from which useful information can be obtained. The sensitivity value can be dependent on the noise floor.

In particular, the sensitivity value of the component can indicate by how much an IPx value of the component contributes to the total IPx value of the system and the DUT. In other words, the sensitivity value indicates how much a component is "seen" in the measurement results.

In an example, an attenuation of the system (or a system component) can be increased until the total IPx value of system 10 and DUT 20 no longer changes. This "total IPx value" can then be approximated as the IPx value of the DUT 10. For instance, the sensitivity of the component is then minimized.

The display 16 can be configured to display the calculated sensitivity value (s). Alternatively or additionally, the calculated sensitivity values can be displayed on a website which can be viewed on any suitable device not necessarily directly connected to the measurement system 10, e.g., a laptop or a smartphone.

The internal components 13 of the measurement unit 12 can comprise an analog-to-digital converter (ADC). The ADC can be configured to receive and digitalize the first CW signal, the second CW signal and/or the at least one intermodulation signal.

The measurement unit 12 can be configured to discard an IPx measurement if the ADC is in an overload state.

The overload state of the ADC may refer to a state when a signal level at the ADC exceeds a normal range which is, e.g., defined by upper and/or lower threshold values. Measurement results recorded in an overload state could be invalid due to the signal level being outside of the operation range of the ADC.

For example, the input port 11 can be connected to two separate frontends of the system 10. The first frontend can measure high power excitation CW signals and the second frontend can measure low power intermodulation signals. This can enable a higher dynamic range and a better sensitivity for the IPx measurements.

Figure 2:
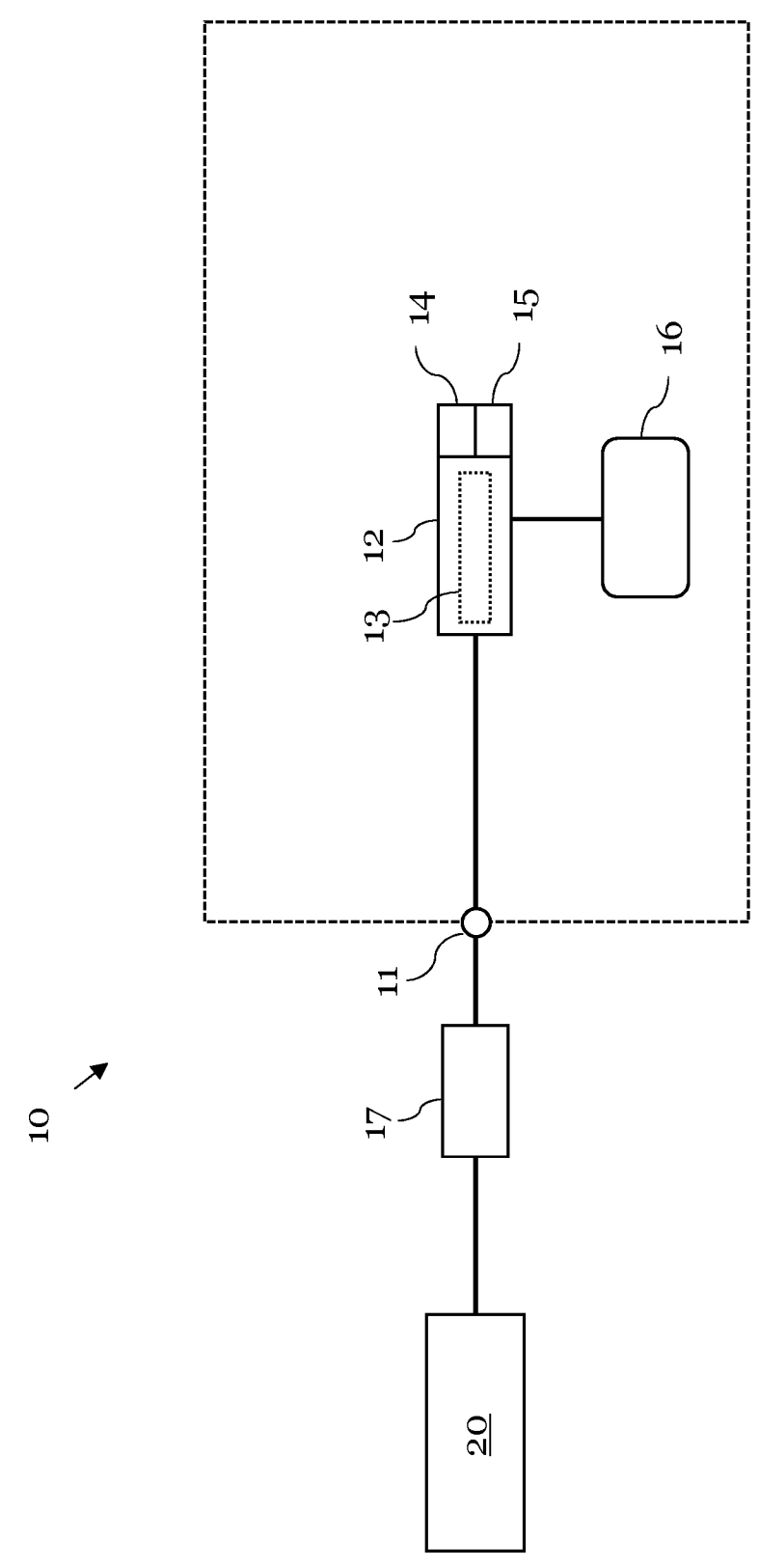
FIG. 2 shows a schematic diagram of a measurement system for measuring an IPx value of a DUT according to an embodiment.

FIG. 2 shows a schematic diagram of the measurement system 10 according to an embodiment.

The measurement system 10 shown in FIG. 2 comprises one or more external components 17 which are connected between the DUT 20 and the input port 11. As such, the DUT 20 is indirectly connectable to the input port 17 through the external component (s) 17. Apart from the additional external components 17, the system 10 shown in FIG. 2 can be identical to the system 10 shown in FIG. 1.

The external components 17 can comprise an attenuator, an amplifier, a mixer and/or a cable. The external components 17 can be components of the system 10 which are arranged outside of a housing of the system 10.

For example, in the first operating mode, the measurement unit 12 is configured to calculate the IPx value of the DUT 20 based on the results of the IPx measurement, on the stored IPx information of internal system components 13 and on stored IPx information of at least one external component 17.

The IPx information of the at least one external component 17 can be entered by a user, e.g. via a user interface, or can be read from a calibration file. In this way, a user can add information on the external component (s) 17, e.g., in case the system 10 cannot automatically receive this information from the external component (s) 17.

The IPx information of the at least one external component can be stored in the memory 15.

Optionally, in the second operating mode, a characteristic of the external component 17 can be changed during at least a further one of the IPx measurements. Subsequently, the IPx value of the DUT can be determined by additionally determining the IPx value of the external component and deducting said IPx value from a total IPx value.

For instance, the user interface can prompt the user to change a characteristic of the external component 17 and/or to set a characteristic of the external component 17 to a certain value and to subsequently confirm this change or setting. The measurement unit 12 can be configured to conduct the further IPx measurement after the user has confirmed said change of the characteristic of the external component 17.

The measurement unit 12 can be configured to also calculate a sensitivity value of the external component (s) 17. This sensitivity value can also be displayed on the display 16.

The external components 17 can further comprise a pre-selectable filter stage comprising at least a first filter function and a second filter function. For instance, the measurement unit 12 is configured to apply the first filter function when measuring the signal level of the first and/or the second CW signal, and to apply the second filter function when measuring the signal level of the at least one inter-modulation signal. In this way, it can be guaranteed that the measured intermodulation signal does not contain compo-nents of the CW signals and vice versa. This can improve the SNR and the control of the signal chain can be improved.

Figure 3:
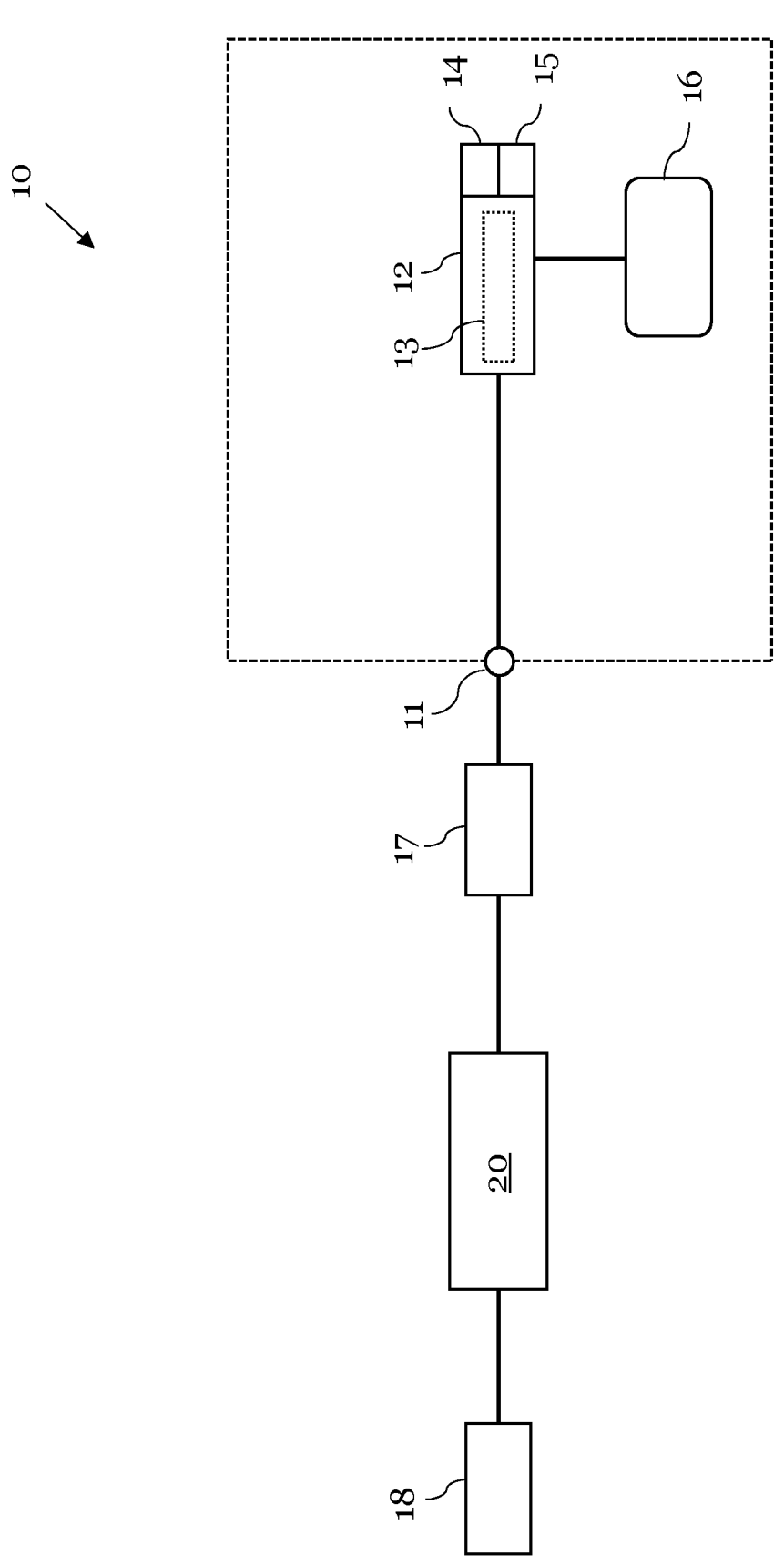
FIG. 3 shows a schematic diagram of a measurement system for measuring an IPx value of a DUT according to an embodiment.

FIG. 3 shows a schematic diagram of the measurement system 10 according to an embodiment.

The measurement system 10 shown in FIG. 3 comprises a signal generator 18 which is configured to generate at least one RF signal which is forwarded to the DUT 20. Apart from the additional signal generator 18, the system 10 shown in FIG. 3 can be identical to the system 10 shown in FIG. 2. Of course, such a signal generator 18 could also be added to the system 10 shown in FIG. 1.

The RF signals can be continuous wave signals. The DUT 20 can emit the first and the second CW signal and the at least one intermodulation signal based on these RF signals.

The signal generator 18 can be configured to generate a first and a second RF signal and to forward said signals to the DUT 20, wherein the first CW signal corresponds to the first RF signal after transmission by the DUT 20 and the second CW signal corresponds to the second RF signal after transmission by the DUT 20. While being transmitted by the DUT 20, the first and second RF signal can excite the intermodulation signal (s).

For example, settings of the signal generator 18 can be adjusted such that a (total) IPx value of the signal generator is increased above a threshold and/or such that the IPx value of the signal generator is maximized. For performing such an adjustment of the signal generator settings, the signal generator 18 can be directly connected to the input port 11 (i.e., not via the DUT).

In a further example, the signal generator 18 can be configured to perform an IQ based generation of the first and second CW signal (e.g. as multi-carrier continuous-wave signals, MCCW signal). For instance, the signal generator 18 can tune the relative phases of the two CW signals to compensate for the IPx value of the signal generator. In particular, the signal generator can further be configured to automatically find the best signal generator for most settings reliable IPx measurements.

Figure 4B:
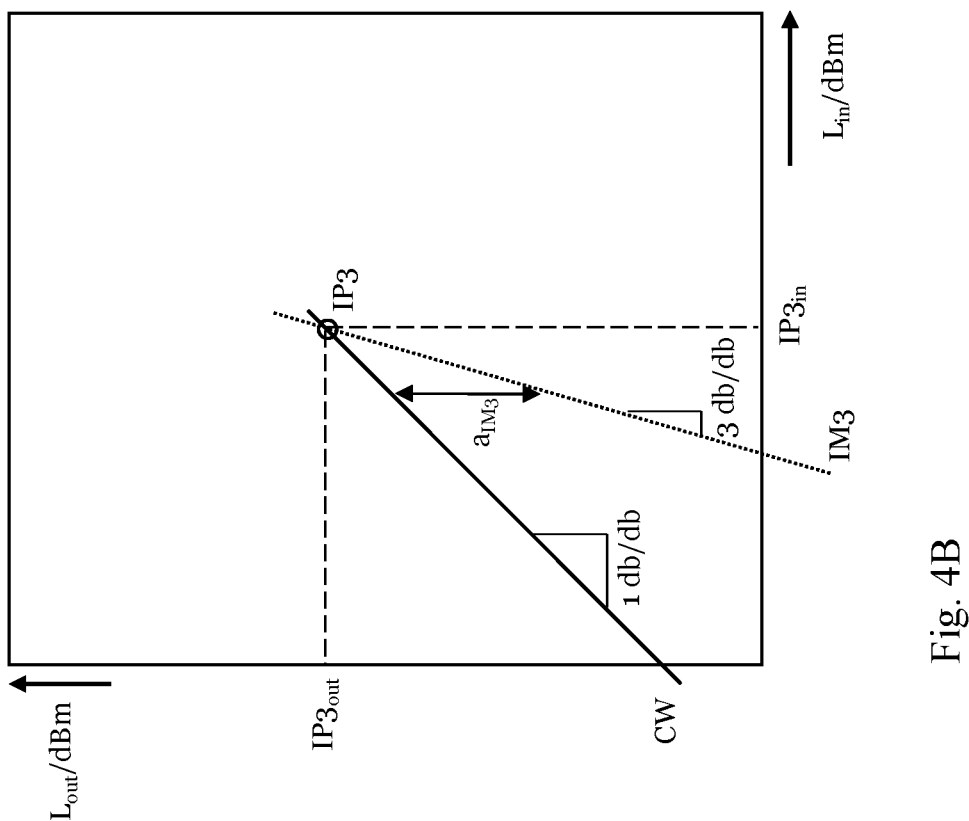
FIGS. 4A-4B show CW signals and their corresponding intermodulation signals according to an embodiment.
Figure 4A:
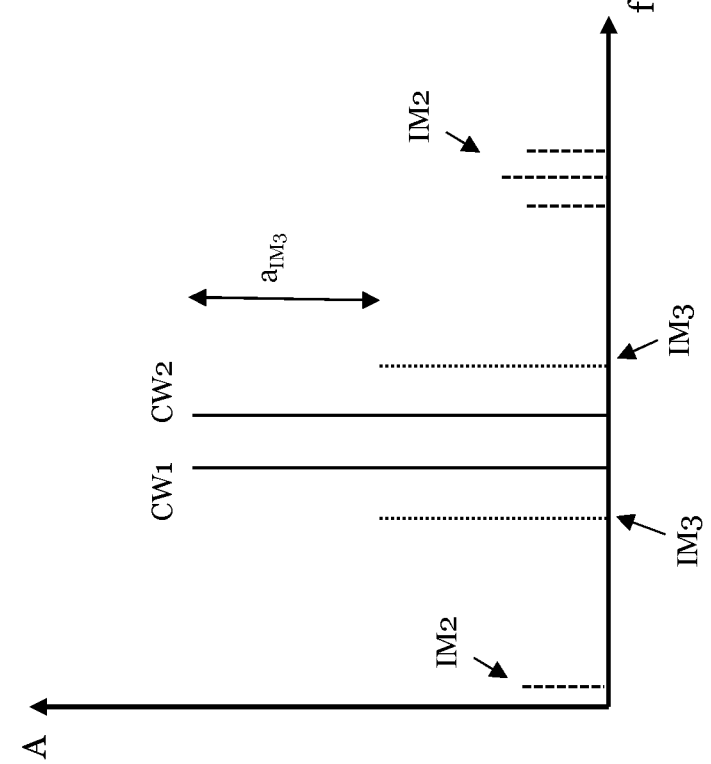

FIGS. 4A-4B show possible CW signals and their corre-sponding intermodulation signals according to an embodi-ment.

FIG. 4A shows the two CW signals CW1 and CW2 together with different intermodulation products of the two CW signals. Thereby, third order intermodulation products IM3 and second order intermodulation products IM2 of the two CW signals are shown.

The two CW signals CW1 and CW2 can have a respective (center) frequency in a GHz range.

Preferably, Both CW signals CW1 and CW2 are relatively close in frequency. In particular, the signals CW1 and CW2 are close enough in frequency such that intermodulation products can form.

For instance, a frequency difference between CW1 and CW2 can be in a range from 1 to 10 MHz or even below 1 MHZ.

Each intermodulation product can form a respective inter-modulation signal which can be received at the input port 11 of the measurement system 10.

If the CW signals are at frequencies $f_{in,1}$ and $f_{in,2}$, the third order intermodulation products IM3 can be found at fre-quencies $2f_{in,1}$-$f_{in,2}$ and $2f_{in,2}$-$f_{in,1}$. For example, if CW1 has a center frequency at 2.399001 GHz and CW2 has a center frequency at 2.400999 GHz than the IM3 signals are at 2.397003 GHZ and 2.402997 GHz.

The difference in signal levels between the third-order intermodulation products and the CW signals CW1 and CW2 is denoted as $a_{Im3}$ in FIGS. 4A and 4B.

FIG. 4B shows a corresponding third order intercept point for the signals in FIG. 4A.

In FIG. 4B, the IP3 value is obtained by plotting input signal levels Lin against output signal levels Lout on a logarithmic scale (units in dBm). This is done for one of the two CW signals (e.g., CW1) or for an average of both CW signals (CW1 and CW2) as well as for one of the IM3 intermodulation signals. The CW signal is thereby linearly increased. As can be seen, the CW signal has a slope of 1 (due to the linear increase), while the IM3 signal has a slope of 3.

The point at which both signals intercept is the third-order intercept point IP3 (also referred to as: TOI). The value of this point can be represented by an IP3 input value or an IP3 output value (IP3 in respectively $IP3_{out}$). The second-order intermodulation products would have a slope of 2 and is generally located at higher input and output signal levels (not shown).

The IP3 value can be calculated based on a measurement of a signal level Le of one of the CW signals (e.g., CW1) and a measurement of a signal level LIM3 of one of the IM3 signals, using:

$$IP3_e = \frac{a_{IM3}}{2} + L_e,$$

wherein $a_{IM3}=L_e-L_{IM3}$.

For instance, an IPx measurement can be carried out in this way when calculating an IP3 value. However, the thus calculated IP3 value comprises components of the DUT 20 and of the measurement system 10.

Figures 5A, 5B:
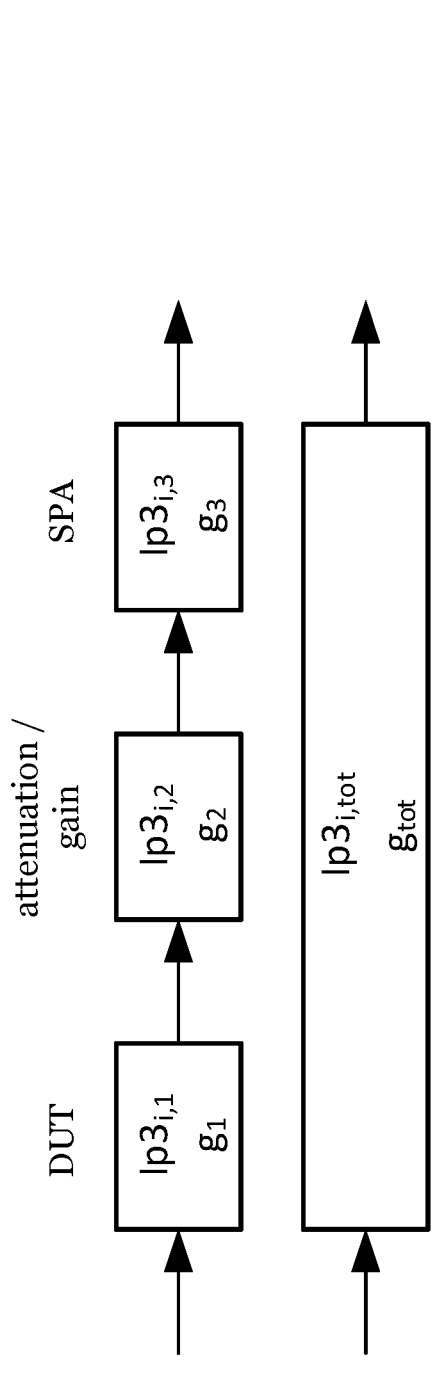
FIGS. 5A-5B show block representations of a DUT and a measurement system according to an embodiment.

FIG. 5A shows a block representation of the DUT 20 and the measurement system 10. For instance, the first block with IP3 value $Ip3_{i,1}$ and gain g1 represents the DUT, the second block with IP3 value $Ip3_{i,2}$ and gain g2 represents a first component of the measurement system 10 (e.g., an attenuator or amplifier stage) and the third block with IP3 value $Ip3_{i,3}$ and gain g3 represents (a) further component (s) of the measurement system (denoted as spectrum analyzer, SPA).

The total IP3 value of the DUT 20 and the system 10 can be expressed by the following formula for cascading non-linearities:

$$IP3_{i,tot} = -10 \cdot \log\left(10^{\frac{-IP3_{i,1}}{10}} + 10^{\frac{g_1-IP3_{i,2}}{10}} + 10^{\frac{g_1+g_2-IP3_{i,3}}{10}} + \dots\right)$$

In particular, in the first operating mode, the IP3 values of the measurement system ($Ip3_{i,2}$ and $Ip3_{i,3}$) are known (e.g., stored in the memory 15). Thus, after calculating $IP3_{i,tot}$ (e.g., based on the signal level of the CW signal and the IM3 signal), the measurement unit 12 can immediately derive the IP3 value of the DUT 20 by solving the above formula for $IP3_{i,1}$ (assuming the gains are known). For example, in the first operating mode, the IP3 values and the gains of the system components can be read from a calibration file stored in the memory 15.

In the second operating mode, however, not all IP3 values of the measurement system 10 are known. Therefore, the total IP3 value is calculated multiple times with multiple IPx measurements, wherein for each IPx measurement one characteristic (or property) of one component of the system 10 is changed, for instance a gain of the component.

For instance, the central block in FIG. 5A represents an internal or external component 13, 17 of the system 10, in particular an attenuation or an amplifier, whose attenuation respectively gain g2 can be modified in a known way in the second operating mode. Preferably, this external or internal component 13, 17 has an IP3 value which goes to infinity.

If the IPx measurement is now performed several times, each time changing g2 in a known way and calculating the total IP3 value, the resulting system of equations can be solved for the IP3 value of the DUT ($Ip3_{i,1}$). In the same way, unknown IPx values of system components can be calculated.

The IPx measurements can thereby be repeated with different attenuations or gains until a minimum SNR value of the intermodulation products is reached.

Furthermore, a more sophisticated signal chain for the measurement system 10, as shown in FIG. 5B, can be considered. The exemplary signal chain in FIG. 5B comprises a CW source, a mechanical attenuation unit, a pre-amplifier, an electrical attenuation unit, mixer stages, IF attenuation units and an ADC of the measurement system 10. Each of these system components can be an internal or an external component 13, 17 of the system.

Several IPx measurements can be conducted in the second operating mode to identify the influence of the different system components and of the DUT 20. For example, in each of these IPx measurements, the measurement 12 unit can change a characteristic of one respective system component (e.g., an internal or external component 13, 17) such that the sensitivity of said component is maximized. In this way, the result of the above formula for cascading nonlinearities is changed as much as possible.

For instance, the measurement system 10 can automatically switch the different components (for example, the preamplifier, the attenuation unit (s), e.g. an electrical attenuation and IF attenuator) in or out of a signal chain to reach different operating points. For each component a measurement strategy can be used to stay out of overload (OVL), achieve a minimum SNR and/or reach a minimum sensitivity for the component. The thus derived IP3 values of the system can be stored in a calibration file.

In another alternative, the second operating mode could also be carried out in the following way: The measurement system 10 increases an internal attention (e.g., via the external or internal components 13, 17) to increase the IP3 value of the system 10 and thereby conducts several IPx measurements until the IP3 value doesn't change anymore. This value can be assumed as the IP3 value of the DUT 20. However, this simplified approach can be limited by the noise floor of the measurements and is likely not successful with every type of DUT.

For instance, in all of the above approaches, the measurement unit 12 and, in particular, the control and/or processing unit 14 can be configured to calculate a signal level of a noise floor of the intermodulation signal (s). Based on this noise floor, the measurement unit 12 can calculate the SNR value of the intermodulation signal.

If the measurement unit 12 thereby finds that the SNR value of the intermodulation signal is below a threshold value, it can be configured to discard the corresponding IPx measurement. In this way, only IP3 values of the DUT and/or of system components are calculated which are not "buried" in noise and have a high enough sensitivity.

The above calculation method can be used analogously to calculate different IPx values, such as IP2, IP4, or IP5 values, of the DUT 20.

The measurement unit 12 can further be configured to output an information to a user which indicates a quality of an IPx measurement. The information can comprise an SNR, a sensitivity, a difference between signal levels of inter-modulation signals or a difference of signal levels of the CW signals.

Furthermore, when displaying the measurement results, e.g. in the display 16, the measurement system 10 can be configured to show error bars depending on an SNR of the measurement (s) based on the sensitivity and the difference between signal level of the intermodulation product.

The system 10 can further comprise a graphical user interface (GUI) which can be shown in the display 16. The GUI can show the measurement results. Furthermore, the GUI can allow a user to define additional internal or external components 13, 17 of the signal chain of the system, e.g., external attenuations, preamplifiers, filters, signal generators. These components can have their own IPx values which can be entered by the user via the GUI.

For example, a measurement software used by the system 10 can comprise a wizard which guides a user through IPx measurements of additional internal or external components 13, 17 if their IPx values are unknown.

The measurement system 10 can further comprise a center frequency. Preferably, said center frequency of the system 10 is different from a frequency in the middle between the first and the second CW signal. In this way, negative effects in a capture buffer after a system ADC can be avoided. This can improve the measurement quality.

The measurement system 10 can further be configured to measure the IPx value (s) of the DUT 20 using different CW frequencies and/or different DUT 20 settings. These measurements can be carried out automatically.

For example, the measurement unit 12 can be configured to measure the signal level of the first and/or second CW signal and of the at least one intermodulation signal by IQ averaging, in particular block FPGA based IQ block averaging. In this way, the measurement speed can be enhanced.

For example, the IQ averaging is carried out in the following way: (i) the (CW and/or intermodulation) signals received at the input port 11 are converted into digital samples, e.g. by an ADC of the system 10; (ii) the samples are then frequency-shifted, e.g. by a numerically controlled oscillator and a mixing stage of the system 10; (iii) the samples are subsequently summed or averaged over a defined number of buffer lengths, thereby providing at least one output signal, wherein the buffer length is derived from the repetition frequency and the sampling rate. This can be carried out by a periodic averaging circuit of the system 10, e.g. an FPGA; (iv) a Fourier transformation is performed on the at least one output signal, thereby converting the at least one output signal to frequency domain, e.g. via the control and/or processing unit 14. Thereby in step (ii), the frequency of the samples are shifted such that picket signal portions of the at least one output signal, which can be processed by the control and/or processing unit 14, are associated with frequency bins in the frequency domain.

The generated digital samples can be IQ signals. The periodic averaging circuit can be configured to provide the at least one output signal in real-time and/or to perform IQ averaging on the IQ samples.

All features described above or features shown in the figures can be combined with each other in any advantageous manner within the scope of the invention.

The invention claimed is:

1. A measurement system for measuring an intercept point (IPx) value of a device-under-test (DUT) the measurement system comprising:

an input port which is arranged for being directly or indirectly connected to the DUT; and a measurement unit which is connected to the input port;

wherein the input port is configured to receive a first continuous wave (CW) signal and/or a second continuous wave (CW) signal from the DUT, and to receive at least one intermodulation signal of the first and the second CW signal from the DUT, and to forward the received signals to the measurement unit;

wherein the measurement unit is configured to perform an IPx measurement, the IPx measurement comprising:

measuring a signal level of at least one or both of the first and the second CW signal, and measuring a signal level of the at least one intermodulation signal;

wherein the measurement unit is operable in a first operating mode and/or in a second operating mode;

wherein, in the first operating mode, the measurement unit is configured to calculate the IPx value of the DUT based on the results of the IPx measurement and on stored IPx information of the measurement system; and wherein, in the second operating mode, the measurement unit is configured to conduct a plurality of IPx measurements, wherein a characteristic of the measurement system is changed during at least one of the IPx measurements, and wherein the measurement unit is configured to calculate the IPx value of the DUT based on the plurality of IPx measurements.

2. The measurement system of claim 1, wherein, in the second operating mode, the measurement unit is configured to determine IPx information of the measurement system based on the plurality of IPx measurements.

3. The measurement system of claim 2, further comprising:

a memory;

wherein the measurement unit is configured to store the determined IPx information in the memory.

4. The measurement system of claim 2, wherein, after determining the IPx information in the second operating mode, the measurement system is configured to conduct subsequent measurements of IPx values, for example of further DUTs, in the first operating mode, thereby using the previously determined IPx information.

5. The measurement system of claim 1, wherein, for each IPx measurement, the measurement unit is configured to calculate a sensitivity value of the DUT and/or of the measurement system, in particular of one or more internal components of the measurement system.

6. The measurement system of claim 5, wherein the measurement system is configured to display the calculated sensitivity values.

7. The measurement system of claim 5, wherein, in the second operating mode, the measurement unit is configured to change a characteristic, in particular an attenuation, of at least one internal component of the measurement system during at least one of the IPx measurements until a sensitivity value of the internal component reaches a limit.

8. The measurement system of claim 1, wherein the measurement unit is configured to determine a signal level of a noise floor.

9. The measurement system of claim 8, wherein the measurement unit is configured to calculate a signal-to-noise ratio (SNR) value of the at least one intermodulation signal based on the determined signal level of the noise floor.

10. The measurement system of claim 9, wherein the measurement unit is configured to discard an IPx measurement if the SNR value of the at least one intermodulation signal is below a threshold value.

11. The measurement system of claim 1, wherein the measurement unit comprises an analog-to-digital converter (ADC);

wherein the measurement unit is configured to discard an IPx measurement if the ADC is in an overload state.

12. The measurement system of claim 1, wherein the input port is arranged for being connected to the DUT through at least one external component, such as an attenuator, an amplifier, a mixer and/or a cable.

13. The measurement system of claim 12, wherein, in the first operating mode, the stored IPx information of the measurement system comprises IPx information of the at least one external component; and/or wherein, in the second operating mode, a characteristic of the external component is changed during at least a further one of the IPx measurements.

14. The measurement system of claim 13, further comprising:

a user interface which is configured to prompt a user to manually change a characteristic of the external component;

wherein the measurement unit is configured to perform the further one of the IPx measurements in the second operating mode after the user has confirmed the change of the characteristic.

15. The measurement system of claim 1, wherein the measurement unit is configured to use in-phase and quadrature (IQ) averaging to measure the signal level of the first CW signal, the second CW signal, and/or the at least one intermodulation signal.

16. The measurement system of claim 1, wherein the measurement unit is configured to output a quality information which indicates a quality of an IPx measurement;

wherein the quality information comprises at least one of: a SNR value, a sensitivity value, a difference between the signal levels of the first and the second CW signal, a difference between signal levels of intermodulation products.

17. The measurement system of claim 1, further comprising:

a signal generator which is configured to generate at least one radio frequency (RF) signal and to forward said RF signal(s) to the DUT and/or to the input port;

wherein settings of the signal generator can be adjusted such that an IPx value of the signal generator is increased above a threshold and/or the IPx value of the signal generator is maximized.

18. The measurement system of claim 1, wherein the measurement system comprises a center frequency which is different from a frequency in the middle between the first and the second CW signal.

19. The measurement system of claim 1, further comprising:

a pre-selectable filter stage comprising a first filter function and a second filter function; wherein the measurement unit is configured to apply the first filter function when measuring the signal level of the first and/or the second CW signal, and wherein the measurement unit is configured to apply the second filter function when measuring the signal level of the at least one intermodulation signal.

\* \* \* \* \*